(12) United States Patent
Li et al.

(10) Patent No.: US 10,892,324 B2
(45) Date of Patent: Jan. 12, 2021

(54) VERTICAL FIELD EFFECT TRANSISTOR WITH REDUCED GATE TO SOURCE/DRAIN CAPACITANCE

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Choonghyun Lee, Rensselaer, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/455,045

(22) Filed: Jun. 27, 2019

(65) Prior Publication Data

US 2019/0386101 A1   Dec. 19, 2019

Related U.S. Application Data

(62) Division of application No. 16/008,687, filed on Jun. 14, 2018, now Pat. No. 10,396,151.

(51) Int. Cl.
  *H01L 29/06* (2006.01)
  *H01L 29/423* (2006.01)
  *H01L 29/66* (2006.01)
  *H01L 29/08* (2006.01)
  *H01L 29/78* (2006.01)

(52) U.S. Cl.
  CPC ...... *H01L 29/0653* (2013.01); *H01L 29/0847* (2013.01); *H01L 29/42368* (2013.01); *H01L 29/66666* (2013.01); *H01L 29/7827* (2013.01)

(58) Field of Classification Search
  CPC ............ H01L 29/0653; H01L 29/0847; H01L 29/42368; H01L 29/66666; H01L 29/7827
  USPC ......................................................... 257/329
  See application file for complete search history.

(56) References Cited

U.S. PATENT DOCUMENTS

| 7,586,130 B2 | 9/2009 | Kawashima et al. |
| 9,287,362 B1 | 3/2016 | Basu et al. |
| 9,337,306 B2 | 5/2016 | Peng et al. |
| 9,437,503 B1 | 9/2016 | Mallela et al. |

(Continued)

OTHER PUBLICATIONS

Jun. 27, 2019, U.S. Appl. No. 16/455,045.

(Continued)

*Primary Examiner* — Tu-Tu V Ho
(74) *Attorney, Agent, or Firm* — Tutunjian & Bitetto, P.C.; Randall Bluestone (57) ABSTRACT

A method of forming a fin field effect transistor device is provided. The method includes forming a vertical fin layer on a bottom source/drain layer, and forming one or more fin templates on the vertical fin layer. The method further includes forming a vertical fin below each of the one or more fin templates. The method further includes reducing the width of each of the vertical fins to form one or more thinned vertical fins, wherein at least a portion of the fin template overhangs the sides of the underlying thinned vertical fin. The method further includes depositing a bottom spacer layer on the bottom source/drain layer, wherein the bottom spacer layer has a non-uniform thickness that tapers in a direction towards the thinned vertical fins.

20 Claims, 6 Drawing Sheets

(56) References Cited

U.S. PATENT DOCUMENTS

| | | |
|---|---|---|
| 9,627,511 B1 | 4/2017 | Cheng et al. |
| 9,691,850 B2 | 6/2017 | Cheng et al. |
| 9,698,245 B2 | 7/2017 | Cheng et al. |
| 9,716,170 B1 | 7/2017 | Cheng et al. |
| 9,853,028 B1 | 12/2017 | Cheng et al. |
| 2013/0032876 A1 | 2/2013 | Cheng et al. |
| 2017/0373166 A1 | 12/2017 | Bergendahl et al. |
| 2018/0040716 A1* | 2/2018 | Cheng ................. H01L 27/0886 |

OTHER PUBLICATIONS

Jun. 27, 2019, U.S. Appl. No. 16/455,096.
Jun. 14, 2018, U.S. Appl. No. 16/008,687.
List of IBM Patents or Patent Applications Treated as Related dated Jun. 27, 2019, 2 pages.

\* cited by examiner

VERTICAL FIELD EFFECT TRANSISTOR WITH REDUCED GATE TO SOURCE/DRAIN CAPACITANCE

BACKGROUND

Technical Field

The present invention generally relates to fin field effect transistor (FinFETs) devices, and more particularly to vertical transport FinFETs.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a fin field effect transistor device is provided. The method includes forming a vertical fin layer on a bottom source/drain layer, and forming one or more fin templates on the vertical fin layer. The method further includes forming a vertical fin below each of the one or more fin templates. The method further includes reducing the width of each of the vertical fins to form one or more thinned vertical fins, wherein at least a portion of the fin template overhangs the sides of the underlying thinned vertical fin. The method further includes depositing a bottom spacer layer on the bottom source/drain layer, wherein the bottom spacer layer has a non-uniform thickness that tapers in a direction towards the thinned vertical fins.

In accordance with another embodiment of the present invention, a method of forming a fin field effect transistor device is provided. The method includes growing a bottom source/drain layer on a substrate, and growing a vertical fin layer on the bottom source/drain layer. The method further includes forming one or more fin templates on the vertical fin layer, and forming a vertical fin below each of the one or more fin templates. The method further includes reducing the width of each of the vertical fins to form one or more thinned vertical fins, wherein at least a portion of the fin template overhangs the sides of the underlying thinned vertical fin. The method further includes depositing a bottom spacer layer on the bottom source/drain layer, wherein the bottom spacer layer has a non-uniform thickness that tapers in a direction towards the thinned vertical fins.

In accordance with an embodiment of the present invention, a fin field effect transistor device is provided. The fin field effect transistor device includes a bottom source/drain layer on a substrate, and one or more thinned vertical fins on the source/drain layer. The fin field effect transistor device further includes a bottom spacer layer on the bottom source/drain layer, wherein the bottom spacer layer has a non-uniform thickness that tapers in a direction towards each of the one or more thinned vertical fins. The fin field effect transistor device further includes a gate dielectric layer on the bottom spacer layer and sidewalls of each of the one or more thinned vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 11 is a cross-sectional side view showing top source/drains formed on each of the vertical fins, where the top source/drains fill in a top wedge region formed by the variable thickness top spacer layer, and the bottom spacer layer forms dimpled portions in the overetched regions of

DETAILED DESCRIPTION

Embodiments of the present invention provide field effect transistors (FinFET) devices with better gate edge-to-device channel positioning, and reduced gate-to-source/drain capacitances. The mismatch between vertical gate edge positioning relative to the junction of the vertical fin with the bottom source/drain can be reduced by tapering the bottom spacer thickness proximal to the adjoining vertical fin.

A bottom spacer layer with a non-uniform thickness is provided, where the bottom spacer layer can be tapered proximal to an adjoining vertical fin by shadowing the region with an overhanging hardmask. The overhanging hardmask can reduce the amount of bottom spacer layer material deposited by a directional deposition process adjacent to the vertical fin. The bottom spacer layer can have a lesser thickness in the bottom corners with the vertical fin(s), and a greater, more uniform thickness in the exposed regions between the hardmasks and vertical fins. The overlap capacitance between a gate structure and a source/drain can be reduced by the tapering.

Exemplary applications/uses to which the present invention can be applied include, but are not limited to: vertical finFETs, complementary metal oxide silicon (CMOS) field effect transistors (FETs) formed by coupled finFETs, and digital gate devices (e.g., NAND, NOR, XOR, etc.).

It is to be understood that aspects of the present invention will be described in terms of a given illustrative architecture; however, other architectures, structures, substrate materials and process features and steps can be varied within the scope of aspects of the present invention.

Figure 1:
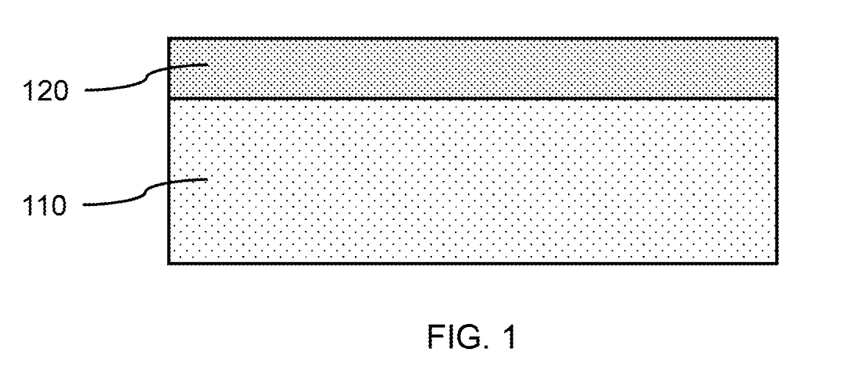
FIG. 1 is a cross-sectional side view showing a bottom source/drain layer formed on a substrate, in accordance with an embodiment of the present invention.

Referring now to the drawings in which like numerals represent the same or similar elements and initially to FIG. 1, a cross-sectional side view of a bottom source/drain layer formed on a substrate is shown, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The substrate 110 or active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

In various embodiments, a bottom source/drain layer 120 can be formed on the substrate, where the bottom source/drain layer 120 can be formed by epitaxial growth or heteroepitaxial growth on the top surface of the substrate 110. The bottom source/drain layer 120 can be a crystalline semiconductor material, including, but not limited to, silicon (Si), silicon-germanium (SiGe), and germanium (Ge), that can include a dopant. The dopant can be an n-type dopant (e.g., phosphorus (P), arsenic (As)) or p-type dopant (e.g., boron (B), gallium (Ga)). The dopant can be introduced into the bottom source/drain layer 120 during formation (i.e., in situ) or after formation (i.e., ex situ), for example, by ion implantation. Although the bottom source/drain layer 120 is shown as formed at the beginning, a bottom source/drain layer 120 can also be formed after the formation of vertical fins.

In various embodiments, the bottom source/drain layer 120 can have a thickness in a range of about 20 nanometers (nm) to about 60 nm, or in a range of about 30 nm to about 50 nm, although other thicknesses are also contemplated.

Figure 2:
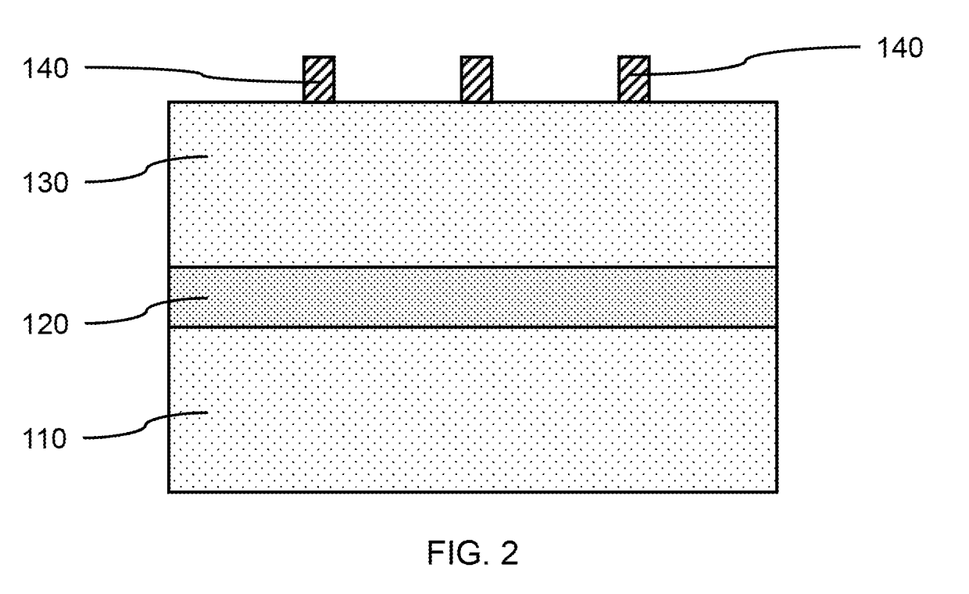
FIG. 2 is a cross-sectional side view showing a vertical fin layer on the bottom source/drain layer, and a plurality of fin templates formed on the vertical fin layer, in accordance with an embodiment of the present invention.

FIG. 2 is a cross-sectional side view showing a vertical fin layer on the bottom source/drain layer, and a plurality of fin templates formed on the vertical fin layer, in accordance with an embodiment of the present invention.

In one or more embodiments, a vertical fin layer 130 can be formed on the bottom source/drain layer 120, where the vertical fin layer 130 can be formed by epitaxial growth or heteroepitaxial growth on the top surface of the bottom source/drain layer 120.

In various embodiments, the vertical fin layer 130 can be a semiconductor material, including, but not limited to, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a combination thereof. In various embodiments, the vertical fin layer 130 can be the same material as the substrate 110 or active semiconductor layer.

In one or more embodiments, a fin template layer can be formed on the vertical fin layer 130, where the fin template layer can be formed by a blanket deposition, for example, chemical vapor deposition (CVD), plasma enhanced CVD (PECVD), physical vapor deposition (PVD) or a spin-on process, on the vertical fin layer 130. The fin template layer can be patterned using spacer image transfer (SIT), lithography or other patterning techniques to form one or more fin templates 140 on the top surface of the vertical fin layer 130.

In various embodiments, the fin templates 140 can be a hard mask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. In various embodiments, a thin (i.e., <3 nm) oxide layer can be between the top surface of the vertical fin layer 130 and the fin template 140.

In various embodiments, the fin templates 140 can have a width in a range of about 8 nm to about 30 nm, or about 10 nm to about 25 nm, or about 12 nm to about 15 nm, although other widths are also contemplated.

In various embodiments, the fin templates 140 can be separated by a distance (between facing sidewalls) that determines the spacing of subsequently formed vertical fins.

The fin templates 140 can be separated by a distance in a range of about 15 nm to about 70 nm, or about 20 nm to about 50 nm, or about 25 nm to about 35 nm, although other separation distances are also contemplated.

Figure 3:
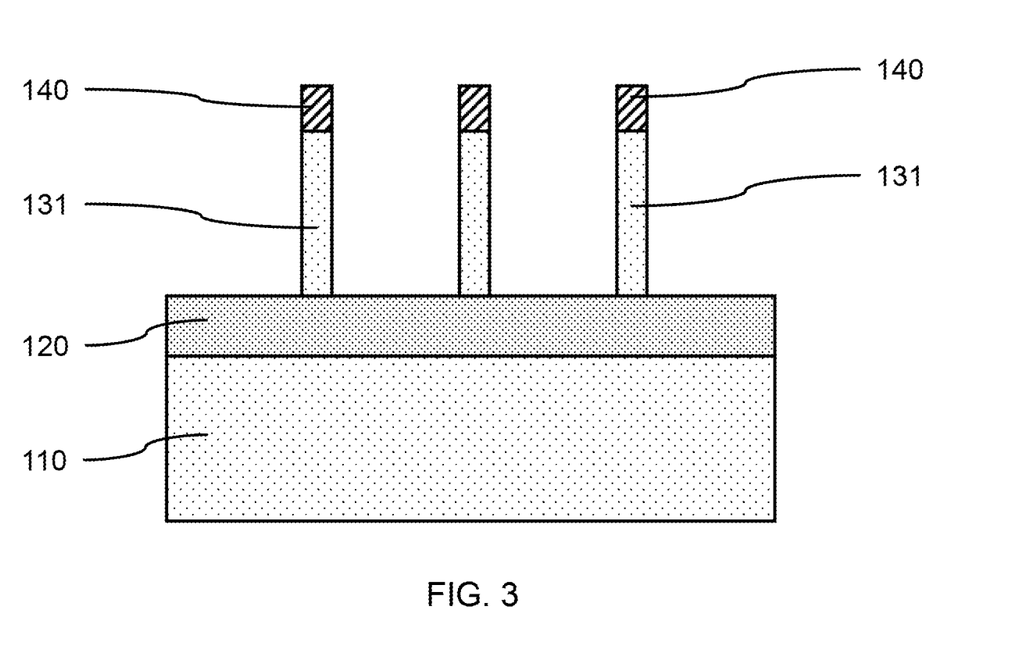
FIG. 3 is a cross-sectional side view showing a plurality of vertical fins formed on the bottom source/drain layer with the fin templates on the vertical fins, in accordance with an embodiment of the present invention.

FIG. 3 is a cross-sectional side view showing a plurality of vertical fins formed on the bottom source/drain layer with the fin templates on the vertical fins, in accordance with an embodiment of the present invention.

In various embodiments, one or more vertical fins 131 can be formed on the bottom source/drain layer 120 with a fin template 140 on each of the vertical fins 131, in accordance with an embodiment of the present invention. The vertical fins 131 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 131 may be formed by a direct write process or double patterning process using, for example, immersion lithography, extreme ultraviolet lithography, or x-ray lithography followed by etching.

In various embodiments, the vertical fins 131 can have a width in a range of about 8 nm to about 30 nm, or about 10 nm to about 25 nm, or about 12 nm to about 15 nm, although other widths are also contemplated. The width of the vertical fins 131 can be the same as the width of the fin templates 140.

In various embodiments, the vertical fins 131 can have a height in the range of about 15 nanometers (nm) to about 100 nm, or about 15 nm to about 50 nm, or about 50 nm to about 100 nm, or about 30 nm to about 70 nm, although other heights are contemplated.

In various embodiments, the adjacent vertical fins 111 can be separated by a distance in a range of about 20 nm to about 70 nm, or about 20 nm to about 50 nm, or about 30 nm to about 40 nm, although other distances are also contemplated.

In various embodiments, a fin template 140 may be on each vertical fin 132, where the fin template 140 is formed during the patterning process. The bottom source/drain layer 120 can be below the vertical fins 132, where the bottom source/drain layer 120 and vertical fin(s) 132 form a vertical transport fin field effect transistor (VT FinFET).

Figure 4:
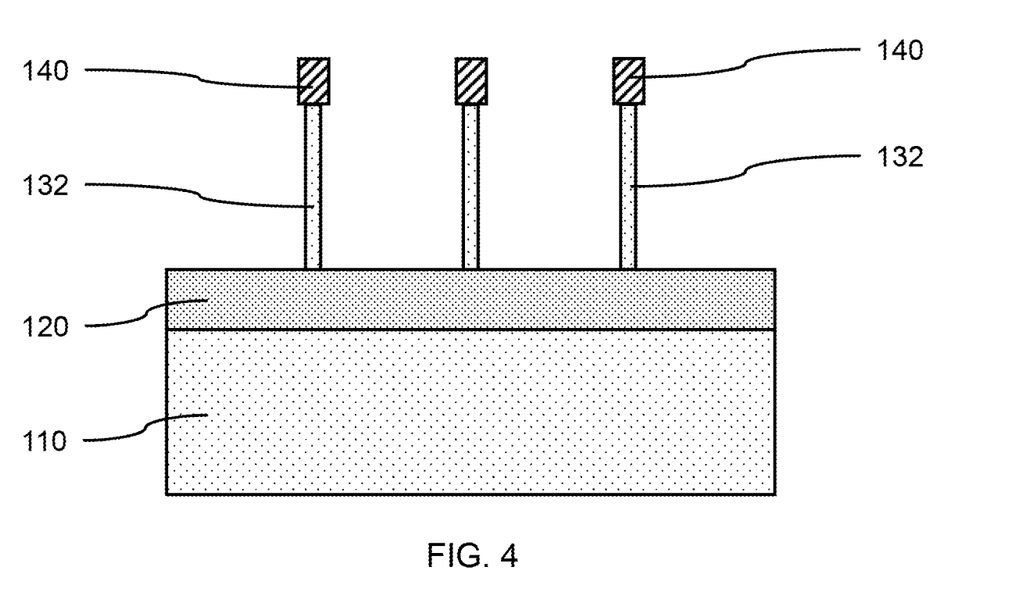
FIG. 4 is a cross-sectional side view showing a plurality of thinned vertical fins formed on the bottom source/drain layer with the fin templates on the vertical fins, in accordance with an embodiment of the present invention.

FIG. 4 is a cross-sectional side view showing a plurality of thinned vertical fins formed on the bottom source/drain layer with the fin templates on the vertical fins, in accordance with an embodiment of the present invention.

In one or more embodiments, the width of the vertical fins 131 can be reduced to form thinned vertical fin(s) 132, where the width of the vertical fins 131 can be reduced by using an isotropic etch, for example, a wet chemical etch, a dry plasma etch, or a combination thereof. In various embodiments, the width of the vertical fins 131 can be reduced by oxidizing a portion of the vertical fins 131 and stripping the oxide layer.

In various embodiments, the thinned vertical fins 132 can have a width in a range of about 4 nm to about 28 nm, or about 6 nm to about 26 nm, or about 6 nm to about 20 nm, or about 5 nm to about 15 nm, although other widths are also contemplated. The width of the thinned vertical fin 132 can be less than the width of the fin template 140 on the thinned vertical fin, where a portion of the fin template 140 overhangs the underlying thinned vertical fin.

In various embodiments, the fin template 140 can overhang the sides of the underlying thinned vertical fin by a distance of about 1 nm to about 10 nm, or about 2 nm to about 5 nm, although other overhang distances are also contemplated. The distance that the fin template 140 overhangs the underlying thinned vertical fin 132 can be the same on all sides of the thinned vertical fin. The overhanging portion of the fin template 140 can shadow the underlying surfaces and sidewalls of the vertical fin.

Figure 5:
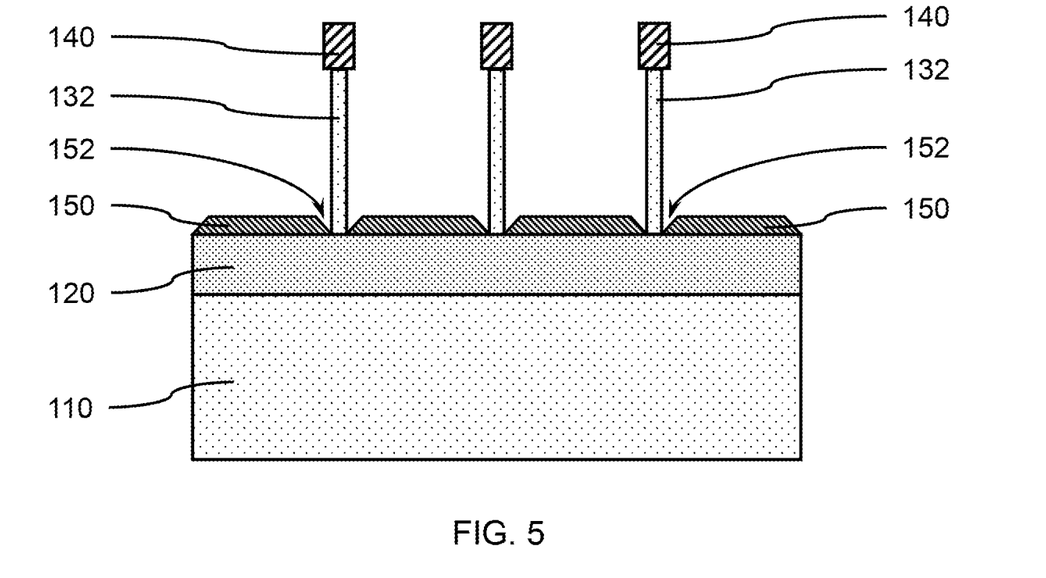
FIG. 5 is a cross-sectional side view showing a non-uniform thickness bottom spacer layer formed on the bottom source/drain layer, in accordance with an embodiment of the present invention.

FIG. 5 is a cross-sectional side view showing a non-uniform thickness bottom spacer layer formed on the bottom source/drain layer, in accordance with an embodiment of the present invention.

In one or more embodiments, a bottom spacer layer 150 can be formed on the exposed surface of the bottom source/drain layer, where the bottom spacer layer 150 can be formed by a directional deposition, for example, a high density plasma (HDP) deposition, physical vapor deposition (PVD), or a gas cluster ion beam (GCIB) deposition. The bottom spacer layer 150 can also be formed by non-conformal deposition techniques, such as plasma enhanced chemical vapor deposition (PECVD). The material of the bottom spacer layer 150 can be preferentially formed on surfaces substantially perpendicular to the direction of the deposition, while the surfaces substantially parallel with the direction of deposition can remain essentially uncovered. The overhanging portions of the fin templates 140 can shadow the regions of the bottom source/drain layer 120 adjacent to the thinned vertical fins 132, where less material may be deposited on the shadowed region(s) depending on the extent of the beam divergence (i.e., increase in beam diameter or radius with distance from the beam source or aperture) of the deposition process (e.g., ion beam, physical vapor trajectory, gas cluster trajectory). Spacer material includes suitable dielectric material, but is not necessarily limited to, silicon boron nitride (SiBN), siliconborocarbonitride (SiBCN), silicon oxycarbonitride (SiOCN), SiN or $SiO_2$.

In various embodiments, the bottom spacer layer 150 can have a non-uniform thickness, where the thickness of the bottom spacer layer 150 can vary in a direction parallel with the width of the thinned vertical fins 132 and transverse to the long axis of the thinned vertical fins. The thickness of the bottom spacer layer 150 can taper in the direction towards the thinned vertical fins. The amount that the thickness varies with the distance from the sidewall or end wall of a thinned vertical fin 132 can depend on the distance that the fin template 140 overhangs the sides of the thinned vertical fin and the beam divergence of the deposition process.

In one or more embodiments, the bottom spacer layer 150 can have a thickness in the range of about 5 nm to about 10 nm, or about 10 nm to about 20 nm, in the region between adjacent fin templates 140, although other thicknesses are also contemplated. The thickness of the bottom spacer layer 150 can vary from a minimum in a range of about 5 nm to about 15 nm directly adjoining the sidewall or end wall of the thin vertical fin 132 to the thickness in the region between adjacent fin templates 140. The amount that the thickness of the bottom spacer layer 150 tapers between the sidewall or end wall of the thin vertical fin 132 and the thickness in the region between adjacent fin templates 140, and the cross-sectional profile of the tapered region, can depend on the distance that the fin template 140 extends passed the sidewall or end wall of the thin vertical fin (overhangs) the underlying thinned vertical fin and the beam divergence profile.

In various embodiments, a bottom wedge region 152 can be formed adjacent to the thinned vertical fin(s) 132 by the tapering of the variable thickness bottom spacer layer 150. The bottom wedge region 152 can expose a portion of the adjacent thinned vertical fin 132 below the top surface of the bottom spacer layer 150. The reduced thickness of the bottom spacer layer adjacent to the thinned vertical fin 132 reduces the amount that the overlap between a subsequently formed gate structure and bottom source/drain-to-device channel junction can vary. The thicker position of bottom spacer between the subsequently formed gate and the bottom source/drain region can help reduce the overlap capacitance. The substantially thinner bottom spacer layer adjacent to the thinned vertical fin 132 can help achieve better gate control on the device due to the closer distance between the gate structure and the channel and source/drain junction.

In various embodiments, an isotropic etch, for example a wet chemical etch, or dry plasma etch, can be used to remove extraneous materials from the sidewalls and endwalls of the thinned vertical fins 132 and fin templates 140.

Figure 6:
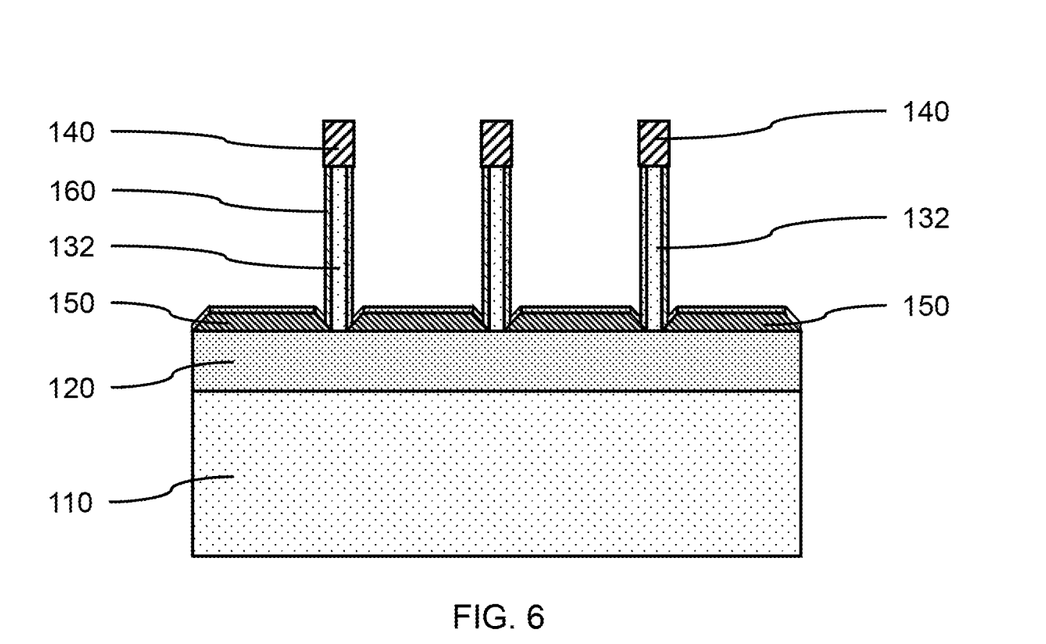
FIG. 6 is a cross-sectional side view showing a gate dielectric layer formed on the exposed surfaces of the thinned vertical fins and variable thickness bottom spacer layer, in accordance with an embodiment of the present invention.

FIG. 6 is a cross-sectional side view showing a gate dielectric layer formed on the exposed surfaces of the thinned vertical fins and variable thickness bottom spacer layer, in accordance with an embodiment of the present invention.

In one or more embodiments, a gate dielectric layer 160 can be formed on the exposed surfaces of the bottom spacer layer 150, thinned vertical fins (132, and fin templates 140. The gate dielectric layer 160 can be formed by a conformal deposition, for example, atomic layer deposition (ALD) or plasma enhanced ALD (PEALD).

In one or more embodiments, a gate dielectric layer 160 can be dielectric material including, but not limited to, silicon oxide (SiO), silicon nitride (SiN), silicon oxynitride (SiON), boron nitride (BN), high-k dielectric materials, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 160 can have a thickness in the range of about 7 Å to about 50 Å, or about 7 Å to about 30 Å, or about 1 nm to about 2 nm, although other thicknesses are contemplated. In various embodiments, the thickness of the gate dielectric layer 160 can be less than or equal to the distance that the fin template 140 overhangs the underlying thinned vertical fin 132. A portion of the gate dielectric layer 160 can be formed in a bottom wedge region 152 adjacent to the thinned vertical fin 132.

Figure 7:
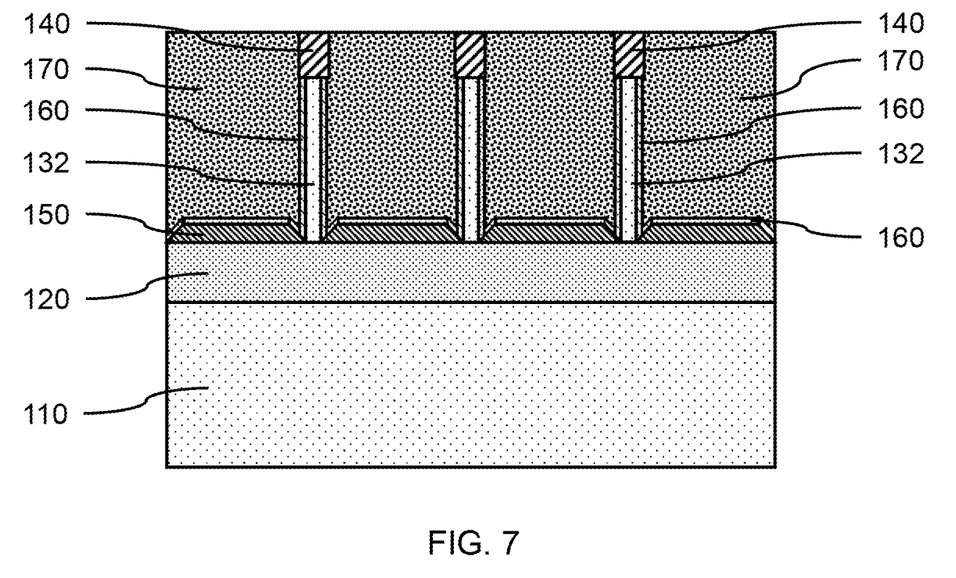
FIG. 7 is a cross-sectional side view showing a gate fill layer formed on the gate dielectric layer, where the gate fill layer fills in a bottom wedge region formed by the variable thickness bottom spacer layer, in accordance with an embodiment of the present invention.

FIG. 7 is a cross-sectional side view showing a gate fill layer formed on the gate dielectric layer, where the gate fill layer fills in a bottom wedge region formed by the variable thickness bottom spacer layer, in accordance with an embodiment of the present invention.

In one or more embodiments, a gate fill layer 170 can be formed on the gate dielectric layer 160, where the gate fill layer 170 can be formed by any suitable deposition technique, including but not limited to, CVD, PECVD, metalorganic CVD (MOCVD), sputtering, plating, evaporation, ion beam deposition, electron beam deposition, laser assisted deposition, chemical solution deposition, or any combination of those methods. The gate fill layer 170 can fill in the bottom wedge regions 152 adjacent to the thinned vertical fins 132.

In one or more embodiments, the gate fill layer 170 can be a conductive material, including, but not limited to, doped polycrystalline or amorphous silicon, germanium, silicongermanium, a metal (e.g., tungsten, titanium, tantalum, ruthenium, zirconium, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive gate fill layer 170 may further comprise dopants that are incorporated during or after deposition.

In various embodiments, a portion of the gate fill layer 170 that extends above the fin templates 140 can be removed using a chemical-mechanical polishing (CMP) to provide a smooth, flat surface.

Figure 8:
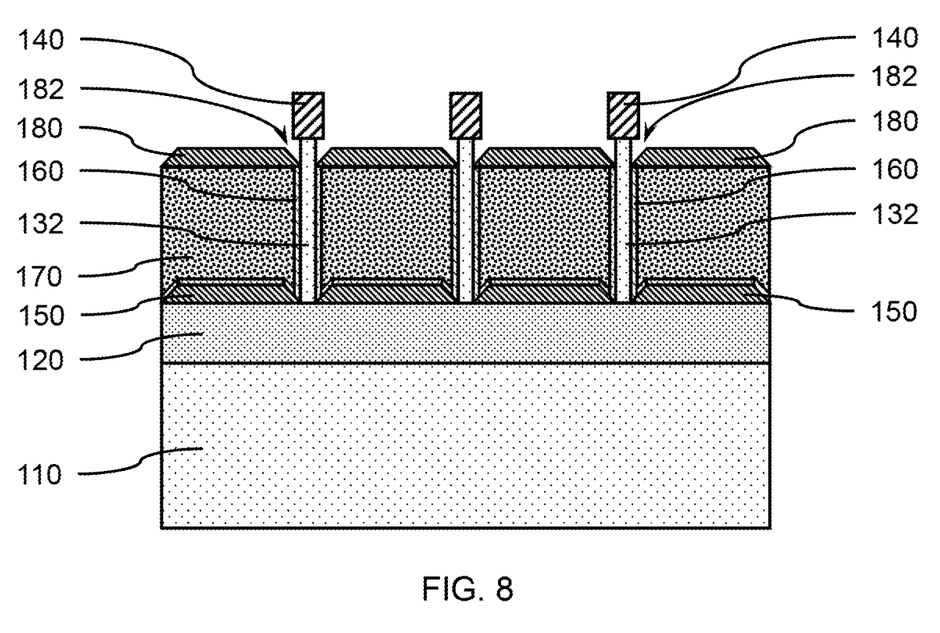
FIG. 8 is a cross-sectional side view showing a variable thickness top spacer layer formed on the gate fill layer and gate dielectric layer, in accordance with an embodiment of the present invention.

FIG. 8 is a cross-sectional side view showing a variable thickness top spacer layer formed on the gate fill layer and gate dielectric layer, in accordance with an embodiment of the present invention.

In one or more embodiments, the height of the gate fill layer 170 can be reduced, for example, by using a directional etch (e.g., reactive ion etch (RIE)), where the height of the gate fill layer 170 can be reduced below the bottom surface of the fin templates 140, such that an upper portion of the thinned vertical fins 132 are exposed. An additional isotropic etch (e.g., wet chemical etch) may be applied to remove the shadowed regions of the gate fill layer 170 and gate dielectric layer 160 adjacent to the thinned vertical fins 132 by the overhanging portions of the fin templates 140.

In various embodiments, the reduction in height of the gate fill layer 170 can expose a portion of the gate dielectric layer 160 on the upper portions of the thinned vertical fins. The exposed portion of the gate dielectric layer 160 can be removed using an isotropic etch (e.g., wet etch) to expose the underlying thinned vertical fins 132.

In one or more embodiments, a top spacer layer 180 can be formed on the exposed surface of the gate fill layer 170, where the bottom spacer layer 150 can be formed by a directional deposition, for example, a high density plasma (HDP) deposition, physical vapor deposition (PVD), or a gas cluster ion beam (GCIB) deposition.

In various embodiments, the top spacer layer 180 can have a non-uniform thickness, where the thickness of the top spacer layer 180 can vary in a direction parallel with the width of the thinned vertical fins 132 and transverse to the long axis of the thinned vertical fins. The amount that the thickness varies with the distance from the sidewall or end wall of a thinned vertical fin 132 can depend on the distance that the fin template 140 overhangs the sides of the thinned vertical fin and the beam divergence of the deposition process.

In one or more embodiments, the top spacer layer 180 can have a thickness in the range of about 5 nm to about 10 nm, or about 10 nm to about 20 nm, in the region between adjacent fin templates 140, although other thicknesses are also contemplated. The thickness of the top spacer layer 180 can vary from a minimum in a range of about 2 nm to about 15 nm, or about 5 nm to about 10 nm directly adjoining the sidewall or end wall of the thin vertical fin 132 to the thickness in the region between adjacent fin templates 140.

The thickness of the top spacer layer 180 can be greater than zero to prevent electrical shorting of a top source/drain to the gate structure.

The bottom spacer and top spacer formation can be similar, given the shadowing effects from the overhanging portions of the fin templates 140. The thinnest portion of the bottom and top spacer layer can be as thin as 1 nm.

In various embodiments, a top wedge region 182 can be formed adjacent to the thinned vertical fin(s) 132 by the tapering of the variable thickness top spacer layer 180. The top wedge region 182 can expose a portion of the adjacent thinned vertical fin 132 below the top surface of the top spacer layer 180 and fin templates 140.

Figure 9:
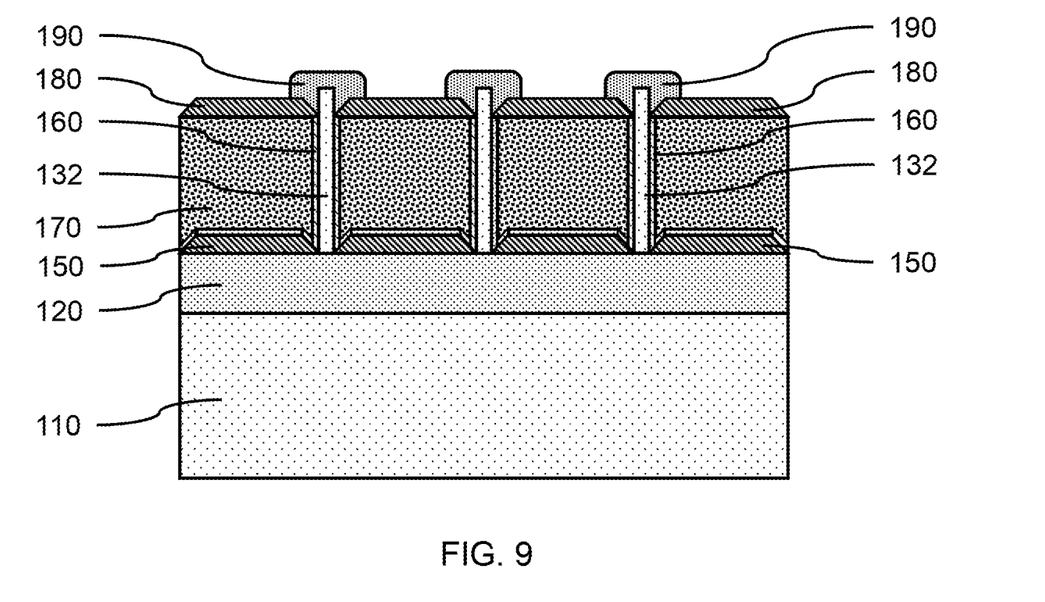
FIG. 9 is a cross-sectional side view showing top source/drains formed on each of the vertical fins, where the top source/drains fill in a top wedge region formed by the variable thickness top spacer layer, in accordance with an embodiment of the present invention.

FIG. 9 is a cross-sectional side view showing top source/drains formed on each of the vertical fins, where the top source/drains fill in a top wedge region formed by the variable thickness top spacer layer, in accordance with an embodiment of the present invention.

In one or more embodiments, the fin templates 140 can be removed from the thinned vertical fins 132 using a selective isotropic etch (e.g., we chemical etch) to expose the top surfaces of the thinned vertical fins.

In one or more embodiments, a top source/drain 190 can be formed on the exposed upper portions of the thinned vertical fins 132, where the top source/drains 190 can be formed by epitaxial or heteroepitaxial growth on the thinned vertical fins 132. The top source/drains 190 can be a crystalline semiconductor material, including, but not limited to, silicon (Si), silicon-germanium (SiGe), and germanium (Ge), that can include a dopant.

In various embodiments, the top source/drains 190 can fill in the top wedge region 182.

Figure 10:
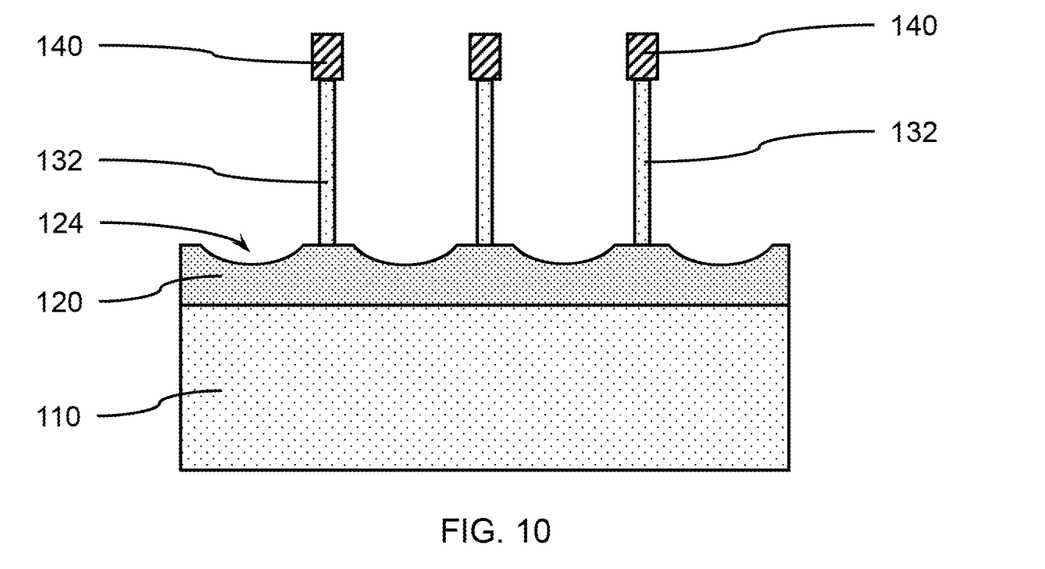
FIG. 10 is a cross-sectional side view showing a plurality of thinned vertical fins formed on a bottom source/drain layer with overetched regions, in accordance with another embodiment of the present invention.

FIG. 10 is a cross-sectional side view showing a plurality of thinned vertical fins formed on a bottom source/drain layer with overetched regions, in accordance with another embodiment of the present invention.

In various embodiments, a portion of the bottom source/drain layer 120 between adjacent fin templates 140 can be partially removed to form dimpled portions 124, where, during the fin RIE process, a slight overetch can form the recessed dimpled portions 124 in the bottom source/drain layer 120. In various embodiments, the bottom source/drain layer 120 can be partially removed using a selective directional etch (e.g., RIE). A small flat portion of bottom source/drain (unetched) at fin corner after RIE vertically underneath the fin hardmask.

Figure 11:
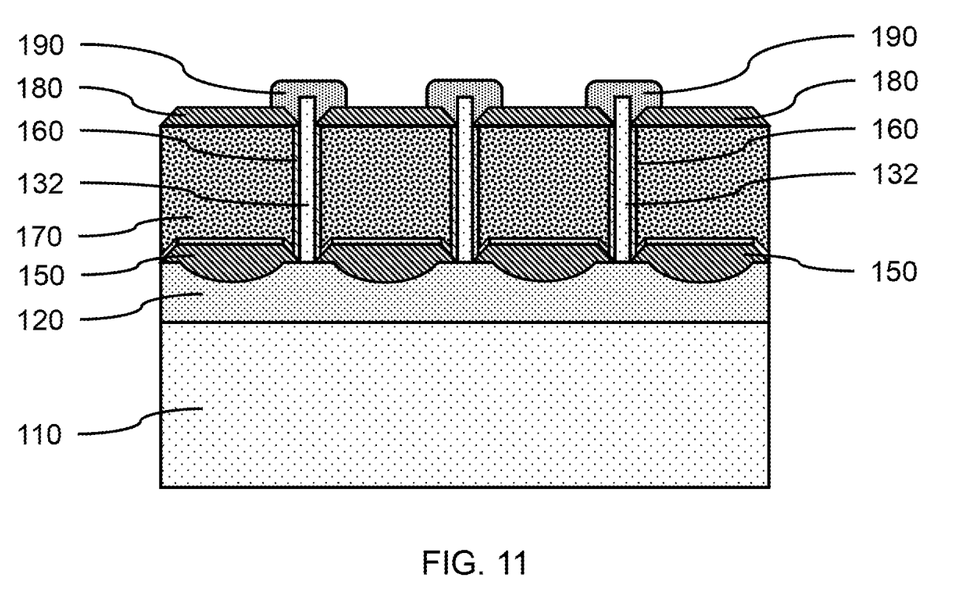

FIG. 11 is a cross-sectional side view showing top source/drains formed on each of the vertical fins, where the top source/drains fill in a top wedge region formed by the variable thickness top spacer layer, and the bottom spacer layer forms dimpled portions in the overetched regions of the bottom source/drain layer, in accordance with another embodiment of the present invention.

In various embodiments, a variable thickness bottom spacer layer 150 can be formed on the bottom source/drain layer 120, where the bottom spacer layer 150 can fill in the dimpled portions of the bottom source/drain layer 120.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," used herein, specify the presence of stated features, integers, steps, operations, elements and/or components, but do not preclude the presence or addition of one of more other features, integers, steps, operations, elements, components and/or groups thereof.

Spatially relative s such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A fin field effect transistor device, comprising:
   a bottom source/drain layer on a substrate;
   one or more thinned vertical fins on the source/drain layer;
   a bottom spacer layer on the bottom source/drain layer, wherein the bottom spacer layer has a non-uniform thickness with a top surface that tapers towards the bottom source/drain layer in a direction towards each of the one or more thinned vertical fins; and
   a gate dielectric layer on the bottom spacer layer and sidewalls of each of the one or more thinned vertical fins.

2. The fin field effect transistor device of claim 1, wherein the non-uniform thickness of the bottom spacer layer forms a bottom wedge region adjacent to each of the one or more thinned vertical fins, and a portion of the gate dielectric layer is in the bottom wedge regions.

3. The fin field effect transistor device of claim 2, further comprising a gate fill layer on the gate dielectric layer, wherein the gate fill layer fills in a remaining portion of the bottom wedge regions.

4. The fin field effect transistor device of claim 3, further comprising a top spacer layer on the gate fill layer, wherein the top spacer layer has a non-uniform thickness that tapers in a direction towards each of the one or more thinned vertical fins.

5. The fin field effect transistor device of claim 4, further comprising a top source/drain on each of the one or more thinned vertical fins, wherein each top source/drain fills in a top wedge region adjacent to each of the one or more thinned vertical fins.

6. The fin field effect transistor device of claim 5, wherein the bottom spacer layer has a thickness in the range of about 5 nm to about 10 nm.

7. The fin field effect transistor device of claim 5, wherein the one or more thinned vertical fins each have a width in a range of about 4 nm to about 28 nm.

8. The fin field effect transistor device of claim 5, wherein the top spacer layer has a thickness in the range of about 5 nn to about 10 nm.

9. The fin field effect transistor device of claim 5, wherein a portion of the bottom source/drain layer is a recessed dimpled portion.

10. A fin field effect transistor device, comprising:
    a bottom source/drain layer on a substrate, wherein a portion of the bottom source/drain layer is a recessed dimpled portion;
    one or more thinned vertical fins on the source/drain layer;
    a bottom spacer layer on the bottom source/drain layer, wherein the bottom spacer layer has a non-uniform thickness that tapers in a direction towards each of the one or more thinned vertical fins;
    a gate dielectric layer on the bottom spacer layer and sidewalls of each of the one or more thinned vertical fins, wherein the non-uniform thickness of the bottom spacer layer forms a bottom wedge region adjacent to each of the one or more thinned vertical fins, and a portion of the gate dielectric layer is in the bottom wedge regions; and
    a top source/drain on each of the one or more thinned vertical fins.

11. The fin field effect transistor device of claim 10, wherein the one or more thinned vertical fins each have a width in a range of about 4 nm to about 28 nm.

12. The fin field effect transistor device of claim 11, further comprising a gate fill layer on the gate dielectric layer, wherein the gate fill layer fills in a remaining portion of the bottom wedge regions.

13. The fin field effect transistor device of claim 12, wherein the bottom spacer layer has a thickness in the range of about 10 nm to about 20 nm.

14. The fin field effect transistor device of claim 12, further comprising a top spacer layer on the gate fill layer, wherein the top spacer layer has a non-uniform thickness that tapers in a direction towards each of the one or more thinned vertical fins.

15. The fin field effect transistor device of claim 14, wherein each top source/drain fills in a top wedge region adjacent to each of the one or more thinned vertical fins formed by the taper in the top spacer layer.

16. A fin field effect transistor device, comprising:
a bottom source/drain layer on a substrate;
one or more thinned vertical fins on the source/drain layer;
a bottom spacer layer on the bottom source/drain layer, wherein the bottom spacer layer has a non-uniform thickness that tapers in a direction towards each of the one or more thinned vertical fins;
a gate dielectric layer on the bottom spacer layer and sidewalls of each of the one or more thinned vertical fins, wherein the non-uniform thickness of the bottom spacer layer forms a bottom wedge region adjacent to each of the one or more thinned vertical fins, and a portion of the gate dielectric layer is in the bottom wedge regions;
a gate fill layer on the gate dielectric layer, wherein the gate fill layer fills in a remaining portion of the bottom wedge regions; and
a top spacer layer on the gate fill layer, wherein the top spacer layer has a non-uniform thickness that tapers in a direction towards each of the one or more thinned vertical fins.

17. The fin field effect transistor device of claim 16, further comprising a top source/drain on each of the one or more thinned vertical fins, wherein each top source/drain fills in a top wedge region adjacent to each of the one or more thinned vertical fins.

18. The fin field effect transistor device of claim 17, wherein the one or more thinned vertical fins each have a width in a range of about 5 nm to about 15 nm.

19. The fin field effect transistor device of claim 17, wherein the bottom spacer layer is made of a dielectric material selected from the group consisting of silicon boron nitride (SiBN), siliconborocarbonitride (SiBCN), silicon oxycarbonitride (SiOCN), SiN and $SiO_2$.

20. The fin field effect transistor device of claim 17, wherein the gate dielectric layer has a thickness in the range of about 7 Å to about 50 Å.

* * * * *